United States Patent
Schaefer et al.

(10) Patent No.: US 9,958,479 B2
(45) Date of Patent: May 1, 2018

(54) DIGITAL OSCILLOSCOPE AND A METHOD WITH PARALLEL ACQUISITION AND SIGNAL POST-PROCESSING

(71) Applicant: Rohde & Schwarz GmbH & Co. KG, Munich (DE)

(72) Inventors: Andrew Schaefer, Munich (DE); Thomas Kuhwald, Markt Schwaben (DE); Bernhard Nitsch, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 406 days.

(21) Appl. No.: 14/634,261

(22) Filed: Feb. 27, 2015

(65) Prior Publication Data
US 2015/0247883 A1  Sep. 3, 2015

(30) Foreign Application Priority Data

Feb. 28, 2014 (DE) .......... 10 2014 203 753
May 6, 2014 (DE) .......... 10 2014 208 464

(51) Int. Cl.
*G01R 13/02* (2006.01)

(52) U.S. Cl.
CPC .......... *G01R 13/02* (2013.01); *G01R 13/0254* (2013.01)

(58) Field of Classification Search
CPC .......... G01R 13/02; G01R 13/0254
USPC .......... 702/67
See application file for complete search history.

(56) References Cited

U.S. PATENT DOCUMENTS

| | | |
|---|---|---|
| 2003/0036872 A1 | 2/2003 | Stark |
| 2003/0125898 A1 | 7/2003 | Stark |
| 2003/0208328 A1* | 11/2003 | Pickerd ............... G01R 13/029 702/67 |
| 2013/0158923 A1* | 6/2013 | Stanton ............. G01R 13/0254 702/76 |
| 2013/0258312 A1* | 10/2013 | Lewis ................... G01S 7/4865 356/4.01 |

FOREIGN PATENT DOCUMENTS

| | | |
|---|---|---|
| JP | 02003185683 | * 7/2003 |
| JP | 2006133114 | 5/2006 |
| JP | 2010096517 | 4/2010 |

OTHER PUBLICATIONS

Zarlingo, Ben "Analyze Agile or Elusive Signals Using Real-Time Measurement and Triggering", Agilent Technologies Inc., Webcast of Apr. 24, 2013, URL:http//www.keysight.com/upload/cmc_upload/Ali/24April2013WebcastSlides.pdf (retrieved on Dec. 23, 2014).

* cited by examiner

*Primary Examiner* — Fernando Hidalgo
(74) *Attorney, Agent, or Firm* — Lee & Hayes, PLLC

(57) ABSTRACT

A method for measuring at least one signal with a digital oscilloscope according to the invention acquires sampled values of the at least one signal in individual time ranges which are each defined in relation to a trigger time of a trigger event, which is detected in the at least one signal in each case by the digital oscilloscope. A post-processing of the sampled values acquired in each case in the individual time ranges then takes place. According to the invention, the acquisition and the post-processing are implemented in parallel.

8 Claims, 6 Drawing Sheets

Legend:
▨ : Phase I
▩ : Phase II
▨ : Phase III

| $AQ_i^1$ | $AQ_{i+1}^1$ | $AQ_{i+2}^1$ | $AQ_{i+3}^1$ | $AQ_{i+4}^1$ | $AQ_{i+5}^1$ | Acquisition channel 1 |
|---|---|---|---|---|---|---|
| $AQ_i^2$ | $AQ_{i+1}^2$ | $AQ_{i+2}^2$ | $AQ_{i+3}^2$ | $AQ_{i+4}^2$ | $AQ_{i+5}^2$ | Acquisition channel 2 |
| $P_{i-1}^1$ | $P_i^1$ | $P_{i+1}^1$ | $P_{i+2}^1$ | $P_{i+3}^1$ | $P_{i+4}^1$ | Signal-post-processing channel 1 |
| $P_{i-1}^2$ | $P_i^2$ | $P_{i+1}^2$ | $P_{i+2}^2$ | $P_{i+3}^2$ | $P_{i+4}^2$ | Signal-post-processing channel 2 |

Fig. 4A

| $AQ_i^1$ | $AQ_{i+1}^1$ | $AQ_{i+2}^1$ | $AQ_{i+3}^1$ | $AQ_{i+4}^1$ | $AQ_{i+5}^1$ | Acquisition channel 1 |
|---|---|---|---|---|---|---|
| $AQ_i^2$ | $AQ_{i+1}^2$ | $AQ_{i+2}^2$ | $AQ_{i+3}^2$ | $AQ_{i+4}^2$ | $AQ_{i+5}^2$ | Acquisition channel 2 |
| $P_{i-2}^1$ | $P_i^1$ | | $P_{i+2}^1$ | | $P_{i+4}^1$ | Signal-post-processing channel 1 |
| $P_{i-2}^2$ | $P_i^2$ | | $P_{i+2}^2$ | | $P_{i+4}^2$ | Signal-post-processing channel 2 |
| $P_{i-1}^1$ | | $P_{i+1}^1$ | | $P_{i+3}^1$ | | Signal-post-processing channel 3 |
| $P_{i-1}^2$ | | $P_{i+1}^2$ | | $P_{i+3}^2$ | | Signal-post-processing channel 4 |

Fig. 4B

| $AQ_i^1$ | | $AQ_{i+1}^1$ | | $AQ_{i+2}^1$ | | $AQ_{i+3}^1$ | | $AQ_{i+4}^1$ | | $AQ_{i+5}^1$ | | Acquisition channel 1 |
|---|---|---|---|---|---|---|---|---|---|---|---|---|
| $AQ_i^2$ | | $AQ_{i+1}^2$ | | $AQ_{i+2}^2$ | | $AQ_{i+3}^2$ | | $AQ_{i+4}^2$ | | $AQ_{i+5}^2$ | | Acquisition channel 2 |
| $P_{i-1}^1$ | $P_{i-1}^2$ | $P_i^1$ | $P_i^2$ | $P_{i+1}^1$ | $P_{i+1}^2$ | $P_{i+2}^1$ | $P_{i+2}^2$ | $P_{i+3}^1$ | $P_{i+3}^2$ | $P_{i+4}^1$ | $P_{i+4}^2$ | Signal-post-processing channel 1 |

Fig. 4C

| $AQ_i^1$ | | $AQ_{i+1}^1$ | | $AQ_{i+2}^1$ | | Acquisition channel 1 |
|---|---|---|---|---|---|---|
| $AQ_i^2$ | | $AQ_i^2$ | | $AQ_{i+1}^2$ | $AQ_{i+2}^2$ | Acquisition channel 2 |
| $P_{i-1}^1$ | $P_{i-1}^2$ | $P_i^1$ | $P_i^2$ | $P_{i+1}^1$ | $P_{i+1}^2$ | Signal-post-processing channel 1 |

Fig. 4D

| $AQ_i^1$ | $AQ_{i+1}^1$ | $AQ_{i+2}^1$ | $AQ_{i+3}^1$ | $AQ_{i+4}^1$ | $AQ_{i+5}^1$ | Acquisition channel 1 |
|---|---|---|---|---|---|---|
| $AQ_i^2$ | $AQ_{i+1}^2$ | $AQ_{i+2}^2$ | $AQ_{i+3}^2$ | $AQ_{i+4}^2$ | $AQ_{i+5}^2$ | Acquisition channel 2 |
| $P_{i-1}^1$ | $P_i^1$ | $P_{i+1}^1$ | $P_{i+2}^1$ | $P_{i+3}^1$ | $P_{i+4}^1$ | Signal-post-processing channel 1 |
| $P_{i-1}^2$ | $P_i^2$ | $P_{i+1}^2$ | $P_{i+2}^2$ | $P_{i+3}^2$ | $P_{i+4}^2$ | Signal-post-processing channel 2 |

DIGITAL OSCILLOSCOPE AND A METHOD WITH PARALLEL ACQUISITION AND SIGNAL POST-PROCESSING

FIELD OF THE INVENTION

The invention relates to a digital oscilloscope and a corresponding method with parallel acquisition and signal post-processing.

BACKGROUND OF THE INVENTION

In a digital oscilloscope, as illustrated, for example, in US 2003/0208328 A1, several measurement signals are typically acquired in each case in one measurement channel and then post-processed for signal presentation on a display. The data exchange between the acquisition and the signal post-processing takes place via a buffer into which the acquired sampled values of the measurement signals are written and from which the acquired sampled values are read out for the signal post-processing.

During the signal post-processing time of the measurement signals, the digital oscilloscope as illustrated in FIG. 1 cannot carry out any acquisition. Only after the expiry of this blind period is a new acquisition possible. Important signal events which occur in this blind period are disadvantageously not detected or displayed by the digital oscilloscope.

The object of the invention is therefore to provide a digital oscilloscope and a corresponding method for measuring a signal with such a digital oscilloscope in order to register and display given signal events in the measurement signal at any time.

SUMMARY OF THE INVENTION

According to one aspect of the invention, the acquisition in an acquisition unit and the signal post-processing in a signal post-processing unit are parallelised in the digital oscilloscope. In this manner, the acquisition is no longer interrupted by the signal post-processing and can be implemented continuously without a blind period. Accordingly, it is possible to detect every signal event which occurs in one or more measurement signals and to display it on the display of the digital oscilloscope.

Parallelising the acquisition and the signal post-processing is preferably implemented, in a first preferred embodiment of the invention, in that the signal post-processing of the last acquired signal region of the at least one signal to be measured takes place during the acquisition of a time range of the at least one signal to be measured. In the first embodiment of the invention, the processing capacity for the signal post-processing corresponds to the processing capacity for the acquisition. For every measured signal, an acquisition channel in an acquisition unit and a signal post-processing channel in a signal post-processing unit are provided in each case.

In a second preferred embodiment of the invention, the parallelisation of the acquisition and the signal post-processing is implemented in that, during the acquisition of every signal to be measured in each case in several successive time ranges of the acquisition, the parallel signal post-processing of every signal to be measured, which was acquired in each case in several successive time ranges of the acquisition before the current sequence of respectively successive time ranges of the acquisition, the signal post-processing is implemented in each case within a single time range. In the second embodiment of the invention, the processing capacity for the signal post-processing corresponds to a multiple—preferably an integer multiple—of the processing capacity for the acquisition. The signal post-processing of the at least one signal to be measured is preferably implemented in a time range of the signal post-processing which directly adjoins the time range of the associated acquisition. Since every time range of the signal post-processing in the second embodiment of the invention extends respectively over several time ranges of the acquisition, one acquisition channel of the acquisition unit is required in each case for the acquisition of every signal to be measured, and several signal post-processing channels of the signal post-processing unit are required in each case for the parallel signal post-processing of the acquired time ranges of the signal to be measured.

In a third embodiment of the invention, the signal post-processing of several signals to be measured which follow one another sequentially and are implemented together in parallel during a single time range of the acquisition takes place in each case in an allocated time range of the signal post-processing. In the third embodiment of the invention, the processing capacity for the acquisition corresponds to a multiple—preferably an integer multiple—of the processing capacity for the signal post-processing. While, in each case, one acquisition channel is provided in an acquisition unit for the acquisition of a signal to be measured, the signal post-processing of several acquired signals is combined in a single signal post-processing channel of the signal post-processing unit.

The data exchange between the acquisition and the signal post-processing preferably takes place via a buffer configured between the acquisition unit and the signal-post-processing unit which provides two storage regions. The buffering of the sampled values of the at least one signal to be measured acquired respectively in one or more time ranges takes place in the one storage region, while the sampled values of the signal to be measured required for the signal post-processing and acquired in one or more time ranges are read out in parallel from the other storage region.

After all of the sampled values of the signal to be measured within one time range or within a given number of several successive time ranges have been buffered, preferably in the one storage region of the buffer, or respectively after all of the sampled values of the signal to be measured acquired in each case within one time range or within a given number of several successive time ranges have been read out for the signal post-processing from the other storage region of the buffer, a switchover of the two storage regions of the buffer is implemented via a switching unit. In this context, the storage region for the buffering becomes the storage region for the reading out, and the storage region for the reading out becomes the storage region for the buffering.

In a first preferred variant of the invention, the time ranges of the acquisition are each directly adjacent to one another. Accordingly, no gaps or respectively blind periods in the acquisition occur.

In a second preferred variant of the invention, the time ranges of the acquisition overlap one another. Accordingly, it is possible to detect and display trigger events in the digital oscilloscope directly following the respectively preceding time range of the acquisition. In the extreme case, a signal post-processing of a trigger event is possible even in the post-trigger time range of the respectively preceding time range of the acquisition.

In the overlapping case, which can be used in the first embodiment of the method according to the invention, the signal post-processing of the sampled values of the signal to be measured acquired within one time range is advantageously obtained from the result of the signal post-processing of the sampled values of the signal to be measured acquired in the respectively preceding time range, with the addition of the newly added sampled values of the signal to be measured within the time range of the acquisition and with the subtraction of the sampled values of the signal to be measured acquired in the respectively preceding time range which are different from the sampled values of the signal to be measured acquired within the time range. This advantageously achieves a simplification and therefore an acceleration of the signal post-processing by comparison with a non-overlapping.

BRIEF DESCRIPTION OF THE DRAWINGS

In the following, the digital oscilloscope according to the invention and the method according to the invention for measuring at least one signal with a digital oscilloscope is explained in detail by way of example in individual embodiments with reference to the drawings. The drawings show:

FIG. 4A a time diagram with time ranges of the acquisition and the signal post-processing and their distribution over the individual acquisition channels and signal post-processing channels according to the first embodiment of the invention;

FIG. 4B a time diagram with time ranges of the acquisition and the signal post-processing and their distribution over the individual acquisition channels and signal post-processing channels according to the second embodiment of the invention;

FIG. 4C a time diagram with time ranges of the acquisition and the signal post-processing and their distribution over the individual acquisition channels and signal post-processing channels according to a third embodiment of the invention;

FIG. 4D a time diagram with time ranges of the acquisition and the signal post-processing and their distribution over the individual acquisition channels and signal post-processing channels according to the third embodiment of the invention with time ranges of the acquisition overlapping in time;

FIG. 4E a time diagram with time ranges of the acquisition and the signal post-processing and their distribution over the individual acquisition channels and signal post-processing channels according to the first embodiment of the invention with un-used processing capacity in the signal post-processing;

DETAILED DESCRIPTION OF THE DRAWINGS

Figure 1:
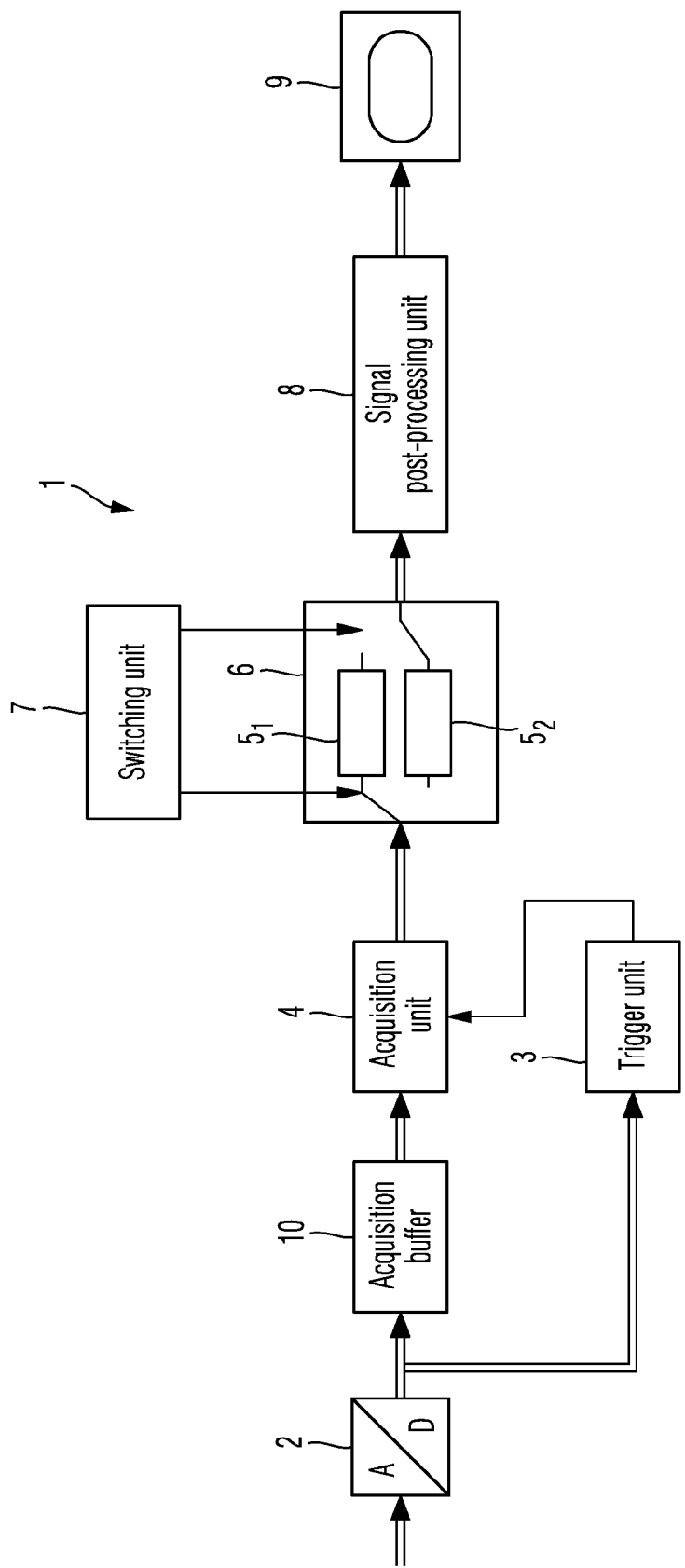
FIG. 1 a block-circuit diagram of an exemplary embodiment of the digital oscilloscope according to the invention.

In the following, the first embodiment of the method according to the invention for measuring at least one signal with a digital oscilloscope is explained in detail on the basis of the flow diagram from FIG. 5A in combination with the digital oscilloscope according to the invention on the basis of the block diagram in FIG. 1.

A signal to be measured or several signals to be measured, which are registered in each case by a probe and supplied to the input region of the digital oscilloscope 1, are converted, in a first method step S10, after the signal pre-processing which typically contains a signal amplification and a signal filtering, in each case in an analog-digital converter 2, into a corresponding digital signal. For reasons of simplicity in FIG. 1, the analog-digital converters for the analog-digital conversion of every individual signal to be measured are not illustrated more than once. An arrow with a double line is used in FIG. 1 to mark the signal paths of several signals to be measured.

In the next method step S20, a trigger event in a signal to be measured or in a combination of several signals to be measured is detected in a trigger unit 3 dependent upon a previously defined trigger condition, and a trigger signal is generated at the trigger time upon the detection of the trigger event.

In the next method step S30, every signal to be measured within a given time range, which comprises a pre-trigger time range disposed before the trigger time and a post-trigger time range disposed after the trigger time, is acquired on the basis of the trigger signal. The acquired sampled values of the signals to be measured in the case of the acquisition are removed from an acquisition buffer 10, which is typically realised as a cyclical buffer memory and writes the generated sampled values of every signal to be measured into the analog-digital converter 2 disposed upstream in each case.

The acquired sampled values of every signal to be measured are buffered in a storage region $5_1$ of a buffer 6 disposed downstream of the acquisition unit 4. For this purpose, during the time range of the acquisition, the acquisition unit 4 is connected by a switching unit 7 to this storage region $5_1$ via a switch illustrated symbolically in the buffer 6.

In method step S40, in parallel with method step S30, within a time range for the signal post-processing which extends parallel to the time range for the acquisition, the reading out of the sampled values of the individual signals to be measured acquired in the preceding time range of the acquisition from the respectively other storage region $5_2$ of the buffer 6 is implemented by the signal post-processing unit 8 disposed downstream of the buffer 6. For this purpose, the respectively other storage region $5_2$ of the buffer 6 is connected by the switching unit 7 to the signal-post-processing unit 8 via a switch illustrated purely symbolically in the buffer 6.

The buffer 6 can be realised separately from the acquisition buffer 10, as illustrated in FIG. 1, or can be integrated with the acquisition buffer 10 within a storage unit.

In method step S40, the sampled values of every individual signal to be measured read out from the respectively other storage region $5_2$ of the buffer 6 and acquired in each case in the previous time range are post-processed. The signal post-processing involves, for example, the determination of a frequency distribution of the signal-level values of the individual signals to be measured or the determination of a given averaged signal characteristic determined according to a given averaging method.

Finally, in the next method step S50, the results of the signal post-processing of the individual signals to be measured determined within the respective time range of the signal post-processing are presented on a display 9 disposed downstream of the signal post-processing unit 8.

In the next method step S60, it is determined whether the measurement and display of the individual signals to be measured has been completed. If this is the case, the method according to the invention terminates.

If the measurement has not yet been completed, the switching unit 7 connects the one storage region $5_1$ for the reading out of the acquired and buffered sampled values of the individual signals to be measured to the signal post-processing unit 8 and connects the storage region $5_2$ of the buffer 6 for writing with acquired sampled values of the individual signals to be measured with the acquisition unit 4.

Following this, method step S30 for the acquisition of the sampled values of the individual signals to be measured acquired in the respectively next time range and method step S40 for the signal post-processing of the sampled values of the individual signals to be measured acquired in each case in the current time range are repeated.

Figure 3A:
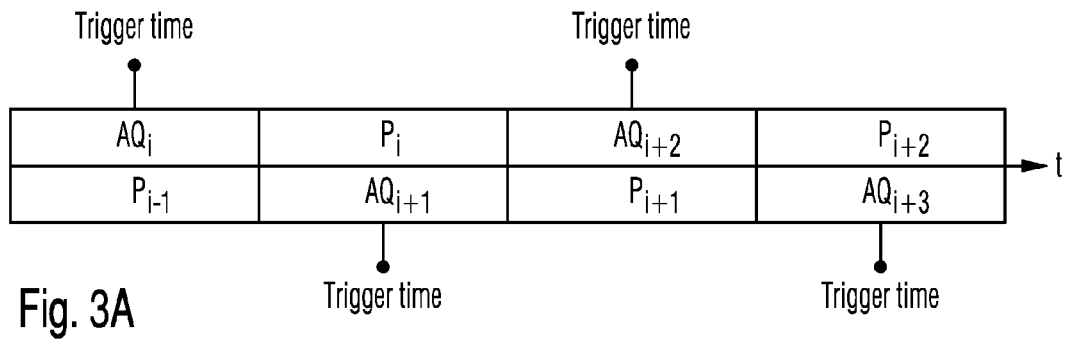
FIG. 3A a time diagram with time ranges of the acquisition and of the signal post-processing according to a first embodiment of the invention.

The time diagram of FIG. 3A for the first exemplary embodiment of the method according to the invention shows the individual time ranges for the acquisition $AQ_i$, $AQ_{i+1}$, $AQ_{i+2}$ and $AQ_{i+3}$ and the time ranges for the signal post-processing $P_{i-1}$, $P_i$, $P_{i+1}$ and $P_{i+2}$ offset in each case by one time range.

FIG. 4A shows the individual time ranges for the acquisition of sampled values for the first embodiment of the method according to the invention, in each case from two signals to be measured respectively in one acquisition channel of the acquisition unit 4, and the time ranges for the signal post-processing in each case of the two signals to be measured in a signal post-processing channel of the signal post-processing unit 8 offset in each case by one time range of the acquisition.

FIG. 4E shows an acquisition of sampled values from two signals to be measured for the first embodiment of the method according to the invention, in each case in one single acquisition channel, and the time range for the parallel signal post-processing in each case in a signal post-processing channel of the signal post-processing unit 8 offset respectively by one time range of the acquisition. The crosshatched areas in the time ranges of the signal post-processing represent time segments of the time ranges of the signal post-processing in which the signal post-processing is already completed and accordingly no further signal post-processing is needed. Since the sum of the signal segments in which no signal post-processing is implemented within the two parallel time ranges for the signal post-processing is smaller than a complete time range of the signal post-processing, no signal post-processing channel can be saved.

Figure 2A:
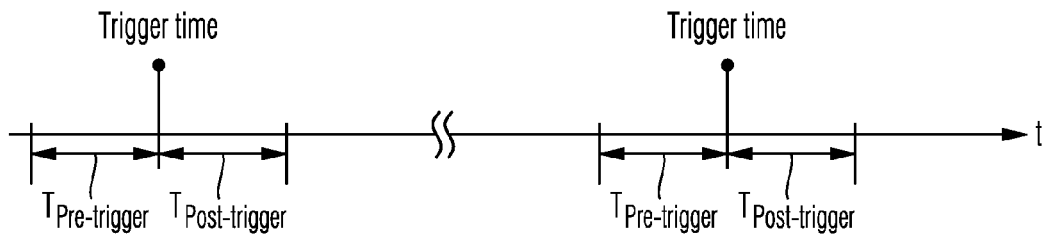
FIG. 2A a time diagram with acquired time ranges according to the prior art.

According to the prior art, the individual time ranges of the acquisition, which each comprise a pre-trigger time range disposed before the trigger time and a post-trigger time range disposed after the trigger time, are clearly separated from one another in time by the intermittent time range for the signal post-processing, which typically requires a multiple of time by comparison with the acquisition, as illustrated in FIG. 2A.

In the case of the parallelisation according to the invention of the acquisition and signal post-processing, time ranges can occur, as in the case of the prior art shown in FIG. 2A, in which in each case no acquisition is implemented. This noncritical case occurs, if two successive trigger events are detected in the signal to be measured which are clearly separated from one another in time.

If the two successive trigger events and the associated successive time ranges of the acquisition are disposed so close together that the resulting gap between the two successive time ranges of the acquisition is too narrow in order to implement a signal post-processing during this gap, a parallelisation according to the invention of the acquisition and the signal post-processing is required.

Figure 2B:
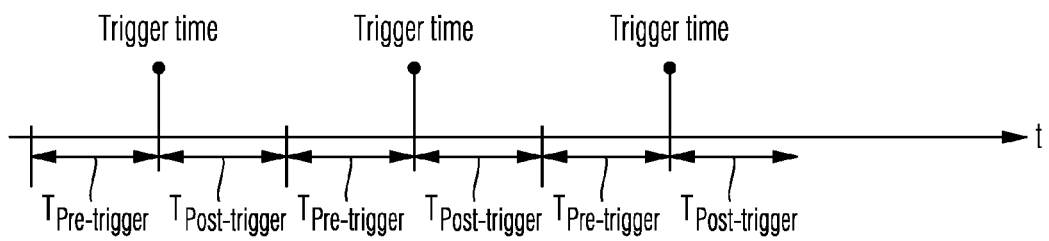
FIG. 2B a time diagram with acquired time ranges adjacent to one another.

FIG. 2B shows the boundary case of a gap-free acquisition, in which the two associated trigger events provide a spacing distance of the size of the time interval of an acquisition.

Figure 2C:
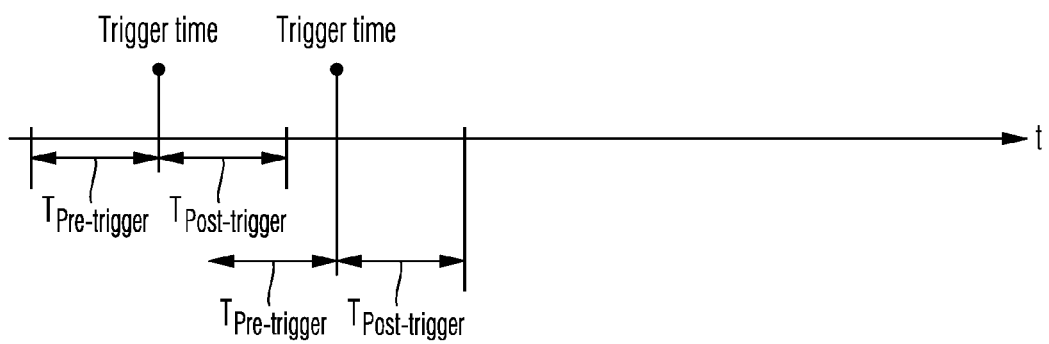
FIG. 2C a time diagram with overlapping time ranges.
Figure 3B:
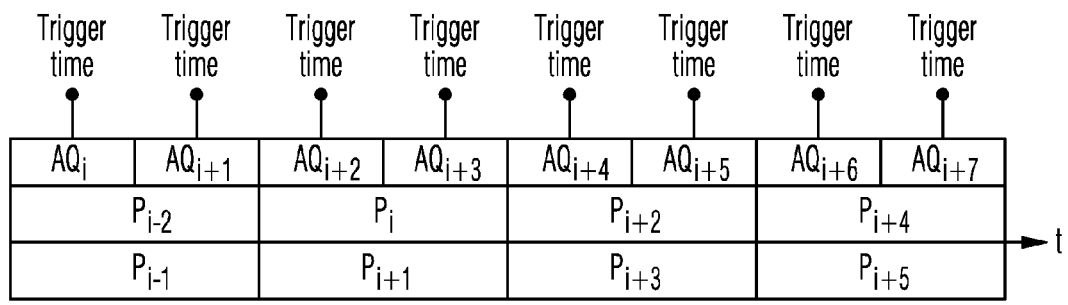
FIG. 3B a time diagram with time ranges of the acquisition and of the signal post-processing according to a second embodiment of the invention.
Figure 3C:
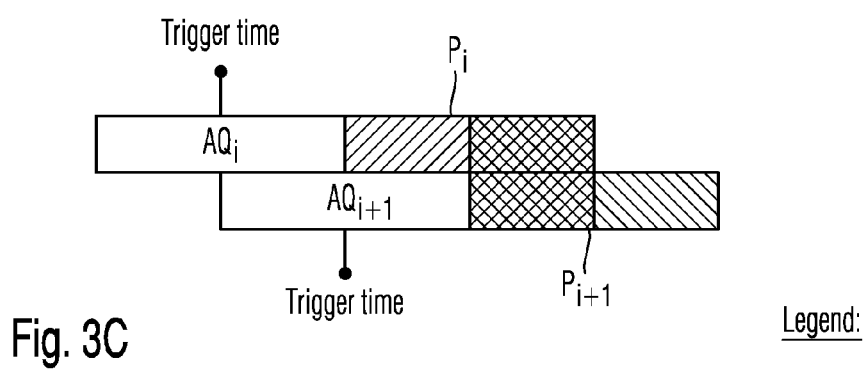
FIGS. 3C, 3D two time diagrams with overlapping time ranges of the acquisition and the signal post-processing.

In a special case, such as that shown in FIG. 2C, the individual successive time ranges of the acquisition can even overlap one another if the trigger time for the second acquisition shown in FIG. 2C takes place directly following the time range for the first acquisition. In a first variant of the overlapping according to the invention of time ranges of the acquisition, in this special case, as illustrated in FIGS. 3C and 3D, the signal post-processing in method step S40 is reduced with regard to its numerical complexity as follows:

As shown in FIG. 3C, which illustrates the special case of two mutually overlapping time ranges, $AQ_i$ and $AQ_{i+1}$ for the acquisition, the respectively associated time ranges $P_i$ and $P_{i+1}$ for the signal post-processing each provide an identical phase—Phase II. Accordingly, in method step S40, it is possible for the determination of the result of the signal post-processing in the respectively following time range $P_{i+1}$ to use the result of the signal post-processing in the respectively preceding time range $P_i$ and to work the sampled values of the respectively following time range $P_{i+1}$, which are not yet contained in Phase I, into the result of the signal post-processing of the respectively preceding time range $P_i$—Phase III—and to eliminate the sampled values of the respectively preceding time range $P_i$ which are not yet contained in the respectively following time range $P_{i+1}$—Phase I—from the result of the signal post-processing in the respectively preceding time range $P_i$.

In this manner, the numerical effort for determining the result of the signal post-processing in the respectively following time range $P_{i+1}$ can be significantly reduced by comparison with a completely new determination of the result of the signal post-processing in the respectively following time range $P_{i+1}$ dependent in each case upon the spacing distance between the successive trigger times.

Figure 3D:
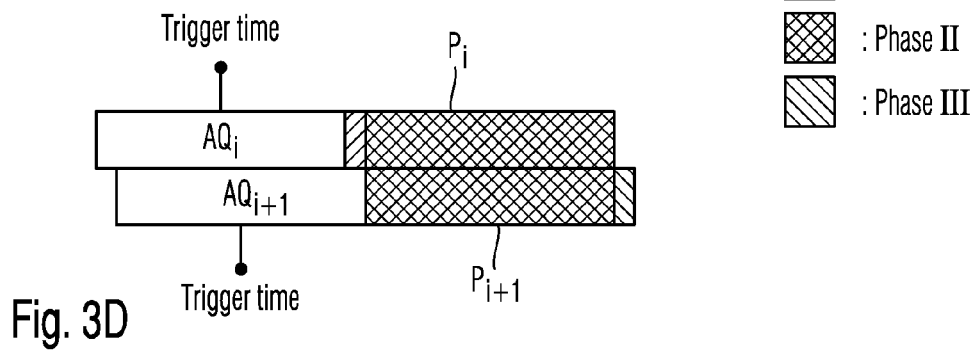

In the case of a trigger time, which is positioned in the range of the post-trigger time range of the preceding trigger time immediately after the preceding trigger time, as shown in FIG. 3D, the attainable reduction in the numerical complexity by comparison with the case of a trigger time which is positioned after the preceding time range for the acquisition is significantly higher, as shown in FIG. 3C.

In a second variant of the overlapping according to the invention of time ranges of the acquisition, the special case illustrated in FIG. 2C of an overlapping of respectively successive time ranges of the acquisition is resolved in that the signal-post-processings associated with the acquisitions in respectively successive time ranges are implemented separately from one another in each case. To make use of the temporarily increased processing capacity resulting from the time overlapping of the acquisition in the associated signal post-processing, additional processing capacities are made available for the signal processing.

In the following, the second embodiment of the method according to the invention for measuring at least one signal with a digital oscilloscope is explained in detail on the basis of the flow diagram in FIG. 5B.

The first three method steps S100, S110 and S120 of analog-digital conversion of the at least one signal to be measured, detection of a previously defined trigger event in a signal to be measured or in a combination of several signals to be measured and acquisition and buffering of sampled values of every signal to be measured correspond to the first three method steps S10, S20 and S30 of the first embodiment of the method according to the invention, and the description will therefore not be repeated at this point.

In the subsequent method step S130, it is determined whether a given, previously specified number of respectively successive trigger events has already occurred, and the sampled values of at least one signal to be measured have therefore already been acquired in an identical number of respectively successive time ranges for the acquisition. If this is not the case, method step S110 is resumed waiting until a new trigger event is identified.

With this identified trigger event, the sampled values of the single signals to be measured occurring within the associated time range of the detected trigger event are acquired in the subsequent method step S120.

The detection of a trigger event and the acquisition of sampled values of the individual signals to be measured which occur within the time range of the acquisition associated with the detected trigger event is repeated until the previously specified number of detected trigger events has been reached and the sampled values of the individual signals to be measured occurring in each case in the associated time ranges have been acquired.

In parallel with the individual acquisitions of the sampled values of the individual signals to be measured occurring in each case within successive acquisition time ranges, in method step S140, the sampled values of the individual signals to be measured acquired respectively in several successive acquisition time ranges before the current sequence of respectively several successive acquisitions are read out from the respectively other storage region $5_2$ of the buffer 6 and post-processed in the signal post-processing unit 8. The results of the signal post-processing are presented on a display connected downstream of the signal post-processing unit 8 in the next method step S150.

When the acquisition of sampled values from signals to be measured, in each case after a given number of acquisition time ranges according to the interrogation in method step S130, and accordingly, the signal post-processing of sampled values of the individual signals to be measured also running in parallel with it in several respectively successive time ranges of the acquisition which precede the current sequence of several respectively successive time ranges of the acquisition has also been completed, it is determined in the next method step S160 whether the measurement and display of the individual signals to be measured on the digital oscilloscope has been completed.

If this is the case, the method according to the invention is terminated. In any other case, in the next method step S170, the two storage regions $5_1$ and $5_2$ of the buffer 6 are connected via the switching unit 7 to the respectively other functional unit, that is, the acquisition unit 4 is connected to the storage region $5_2$, and the signal post-processing unit 8 is connected to the storage region $5_1$ of the buffer 6.

Following this, method step S110 is resumed waiting until a new trigger event for the acquisition of sampled values of the individual signals to be measured is detected in a new time range of the acquisition.

The time diagram in FIG. 3B for the second embodiment of the method according to the invention shows the individual time ranges for the acquisition $AQ_i$, $AQ_{i+1}$, $AQ_{i+2}$, $AQ_{i+3}$, $AQ_{i+4}$, $AQ_{i+5}$, $AQ_{i+6}$ and $AQ_{i+7}$. In each case, the time ranges which are disposed parallel to one another for the signal post-processing $P_{i-2}$ and respectively $P_i$ and $P_{i+1}$ respectively $P_{i+2}$ and $P_{i+3}$ respectively $P_{i+4}$ and $P_{i+5}$ extend in each case over two sequentially successive time ranges for the acquisition $AQ_i$ and $AQ_{i+1}$ respectively $AQ_{i+2}$ and $AQ_{i+3}$ respectively $AQ_{i+4}$ and $AQ_{i+5}$ respectively $AQ_{i+6}$ and $AQ_{i+7}$.

For the second embodiment of the method according to the invention, FIG. 4B shows the individual time ranges for the acquisition of sampled values from two signals to be measured in each case in one acquisition channel of the acquisition unit 4, and the time ranges for the signal post-processing extending in each case over two successive time ranges for the acquisition in respectively four parallel post-processing channels of the signal post-processing unit 8. It is evident that the signal post-processing of sampled values of the two signals to be measured is implemented by way of example in FIG. 4B in each case in two successive time ranges of the acquisition in the four signal post-processing channels, in each case in parallel, and extends respectively over two time ranges of the acquisition. In this context, the signal post-processing of the acquired sampled values of the two signals to be measured is implemented in a time range of the signal post-processing which is directly adjacent to the time range of the acquisition of the associated acquired sampled values of the two signals to be measured.

In the second embodiment of the method according to the invention, the switchover between the writing and the reading of the respective storage regions $5_1$ and $5_2$ of the buffer 6 accordingly takes place separately for the sampled values of each time range of the acquisition.

Figure 5A:
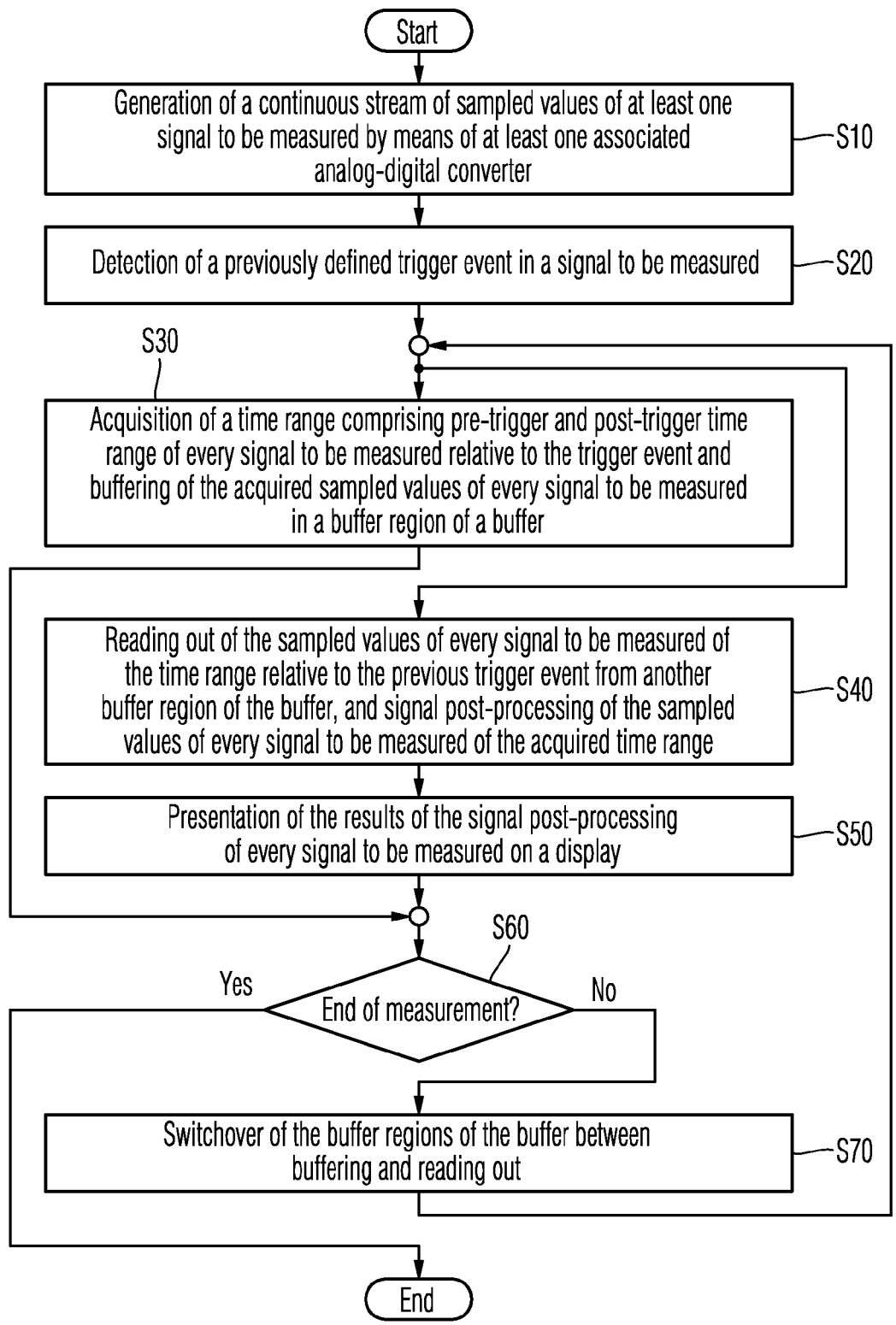
FIG. 5A a flow diagram of a first embodiment of the method according to the invention for measuring at least one signal with a digital oscilloscope.
Figure 5B:
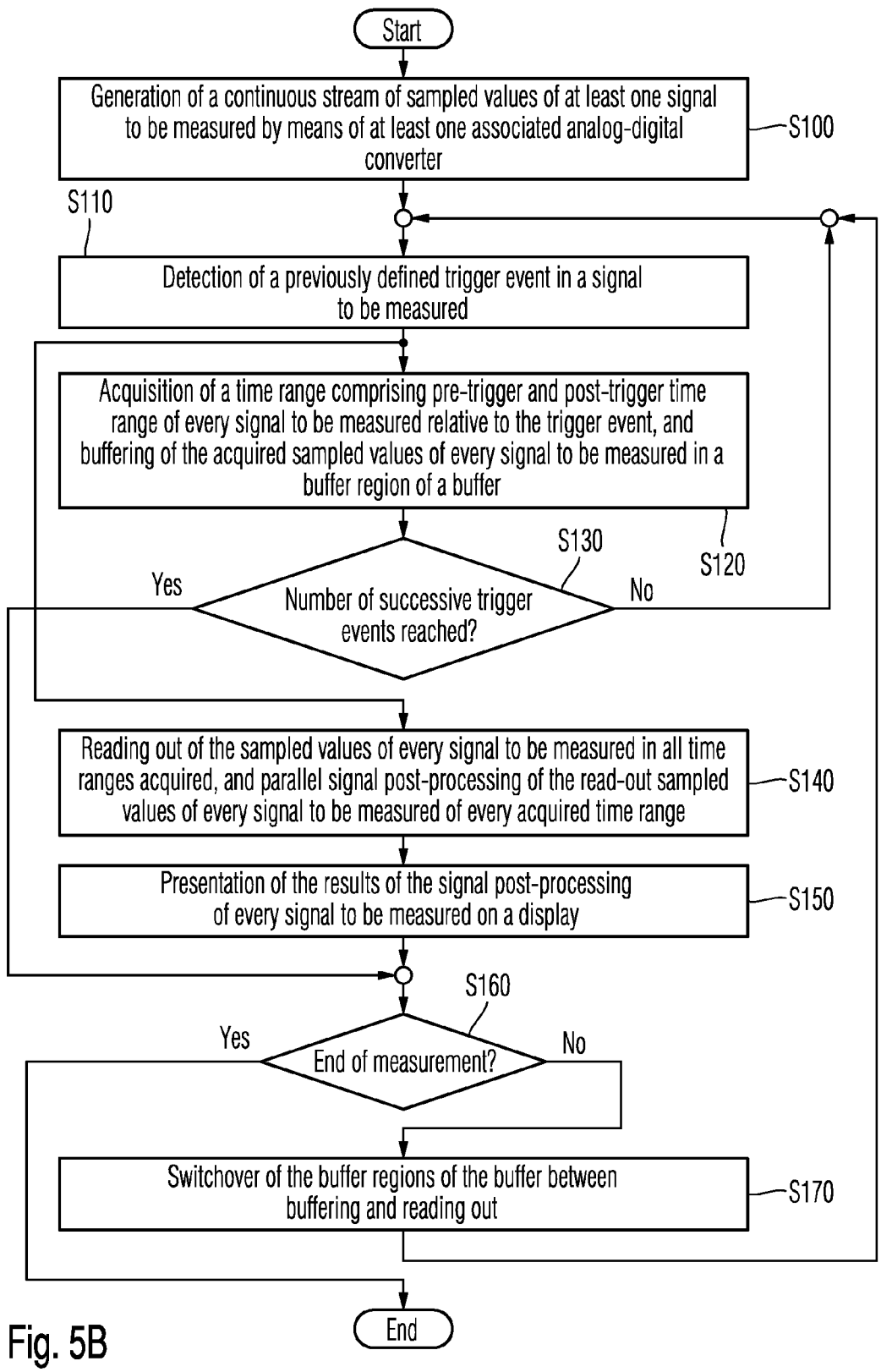
FIG. 5B a flow diagram of a second embodiment of the method according to the invention for measuring at least one signal with a digital oscilloscope.

With the exception of method step S40, the second embodiment of the method according to the invention for measuring at least one signal with a digital oscilloscope corresponds to the flow diagram of the first embodiment of the method according to the invention for measuring at least one signal with a digital oscilloscope in FIG. 5A.

While, in the first embodiment of the method according to the invention, the sampled values of every individual signal to be measured read out from the storage region $5_2$ of the buffer 6 and acquired in the respectively previous time range, as shown in FIG. 4A, are post-processed in parallel in each case in a different signal post-processing channel within an identical time range of the signal post-processing which extends parallel to a subsequent time range of the acquisition, in the third embodiment of the method according to the invention, the sampled values of every individual signal to be measured read out from the storage region $5_2$ of the buffer 6 and acquired in the respectively preceding time range, as shown in FIG. 4C, are post-processed in a single signal post-processing channel, in each case sequentially within a different time range of the signal post-processing, which, in sum, extend parallel to a subsequent time range of the acquisition.

For the case of overlapping time ranges of the acquisition, FIG. 4D shows the case corresponding to the third embodiment of the method according to the invention of a processing requirement of the signal post-processing reduced by comparison with the processing requirement of the acquisition. It is evident that the respective time ranges of the signal post-processing of the two signals to be measured in each case takes place in parallel with the respectively following time range of the acquisition of the first signal to be measured.

The invention is not restricted to the illustrated embodiments and variants. The invention also contains acquisition units with a different number of acquisition channels and signal post-processing units with a different number of signal post-processing units by comparison with the embodiments and variants illustrated in FIGS. 4A to 4E. In particular, the combination of all of the features claimed in the individual claims, all the features disclosed respectively in the description and all the features illustrated in the individual Figs. of the drawings are also covered by the invention.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed:

1. A digital oscilloscope with an acquisition unit and a downstream signal post-processing unit,
    wherein, the acquisition unit and the signal post-processing unit are configured to operate in parallel on a signal during a time segment, the acquisition unit to operate on a second portion of the signal during the time segment and the signal post-processing unit to operate on a first portion of the signal during the time segment;
    wherein a buffer with two storage regions is connected between the acquisition unit and the signal post-processing unit; and
    wherein in alternation, the one storage region is connected to the acquisition unit and the respectively different storage region is connected to the signal post-processing unit.

2. The digital oscilloscope according to claim 1,
    wherein a switching unit is additionally provided for the alternating connection in each case of the one storage region to the acquisition unit and of the respectively other storage region to the signal post-processing unit, or in each case of the one storage region to the signal post-processing unit and of the respectively other storage region to the acquisition unit.

3. The digital oscilloscope according to claim 1,
    wherein the acquisition unit provides several acquisition channels for the acquisition in each case of one signal to be measured by the digital oscilloscope, and the signal post-processing unit provides several signal post-processing channels.

4. The digital oscilloscope according to claim 3,
    wherein each signal post-processing channel is embodied in such a manner that the post-processing of a signal to be measured by the digital oscilloscope takes place in each case within the former acquisition channel.

5. The digital oscilloscope according to claim 3,
    wherein several signal post-processing channels are arranged in such a manner that the post-processing of a signal to be measured by the digital oscilloscope takes place in a parallel distributed manner via several signal post-processing channels.

6. The digital oscilloscope according to claim 3,
    wherein each signal post-processing channel is embodied in such a manner that the post-processing of several signals to be measured by the digital oscilloscope takes place within the former acquisition channel.

7. The digital oscilloscope according to claim 4,
    wherein each signal post-processing channel is embodied in such a manner that the post-processing of every signal to be measured by the digital oscilloscope is implemented in step with the acquisition of every signal to be measured by the digital oscilloscope.

8. The digital oscilloscope according to claim 4,
    wherein each acquisition channel is embodied in such a manner that an overlapping acquisition of several signals to be measured by the digital oscilloscope takes place.

* * * * *